US012658916B2

(12) United States Patent
Sharma et al.

(10) Patent No.: US 12,658,916 B2
(45) Date of Patent: Jun. 16, 2026

(54) RADIO FREQUENCY CIRCUIT WITH BACK GATE-ASSISTED MIXING OF RADIO FREQUENCY AND LOCAL OSCILLATOR SIGNALS

(71) Applicant: GlobalFoundries U.S. Inc., Malta, NY (US)

(72) Inventors: Prateek Kumar Sharma, Bangalore (IN); Indrajit Das, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 58 days.

(21) Appl. No.: 18/775,084

(22) Filed: Jul. 17, 2024

(65) Prior Publication Data

US 2026/0025135 A1     Jan. 22, 2026

(51) Int. Cl.
H03K 17/687     (2006.01)
H03F 3/193     (2006.01)
H10D 30/60     (2025.01)

(52) U.S. Cl.
CPC ......... H03K 17/6871 (2013.01); H03F 3/193 (2013.01); H03F 2200/451 (2013.01); H10D 30/611 (2025.01)

(58) Field of Classification Search
CPC ................ H03K 17/6871; H03F 3/193; H03F 2200/451; H10D 30/611
See application file for complete search history.

(56) References Cited

U.S. PATENT DOCUMENTS 8,249,541 B2 *     8/2012     Bao ........................ H03D 7/125
                                                                455/333
9,923,527 B2       3/2018     McKay
2004/0043741 A1 *   3/2004     Goddard .............. H03D 7/1466
                                                                455/313

FOREIGN PATENT DOCUMENTS

CN          1697311 A   * 11/2005

OTHER PUBLICATIONS

Liscidini et al., "Single-Stage Low-Power Quadrature RF Receiver Front-End: The LMV Cell," IEEE Hournal of Solid-State Circuits, vol. 41, No. 12, Dec. 2006, 10 pages.

(Continued)

*Primary Examiner* — Metasebia T Retebo
(74) *Attorney, Agent, or Firm* — David Cain; Hoffman Warnick LLC

(57)     ABSTRACT

A combined low noise amplifier (LNA), mixer, and voltage-controlled oscillator (VCO) circuit (i.e., an LMV cell) includes four dual-gate transistors. These four transistors include series-connected first and second transistors between a ground rail and a first local oscillator signal node and series-connected third and fourth transistors between the ground rail and a second local oscillator signal node. The first and third transistors are LNA components. The second and fourth transistors are cross-coupled VCO components. Front and back gates of the transistors are biased with different combinations of an RF input signal and complementary local oscillator signals generated on the first and second local oscillator nodes. This front and back gate biasing effectively mixes the RF input signal with each of the complementary local oscillator signals to generate complementary intermediate frequency output signals at output nodes between the first and second transistors and between the third and fourth transistor, respectively.

20 Claims, 5 Drawing Sheets

(56) References Cited

OTHER PUBLICATIONS

Nabet et al., "28 GHz Down-Conversion Mixer with RF Back-Gate Excitation Topology in 22-nm FD-SOI," Proceedings of the 17th European Microwave Integrated Circuits Conference, 2022, downloaded May 30, 2024, 4 pages.

* cited by examiner

RADIO FREQUENCY CIRCUIT WITH BACK GATE-ASSISTED MIXING OF RADIO FREQUENCY AND LOCAL OSCILLATOR SIGNALS

BACKGROUND

The present disclosure relates to radio frequency (RF) circuits and, more particularly, to embodiments of an RF circuit (e.g., for an RF receiver) including a combined low noise amplifier (LNA), RF mixer, and voltage-controlled oscillator (VCO) circuit (also referred to herein as an "LNA-Mixer-VCO" (LMV) cell).

An LMV cell of an RF receiver can include an LNA, an RF mixer, and a VCO. In such an LMV cell, the LNA can amplify a received low-power RF input signal without significantly degrading the signal-to-noise ratio (SNR) and can output a differential RF signal (i.e., RF+ and RF−). The VCO can generate a particular differential local oscillator (LO) signal (i.e., LO+ and LO−). The RF mixer can receive the differential RF signal and the differential LO signal and can mix the signals. More particularly, the RF mixer can use the differential LO signal to convert the differential RF signal into a differential intermediate frequency (IF) output signal (i.e., IF+ and IF−) at a desired frequency (e.g., at a lower frequency than the differential RF signal). A typical LMV cell includes, among other components, one NFET for the LNA, two NFETs for the RF mixer, and two NFETs for the VCO. The arrangement of the NFETs in the LMV cell is symmetric with each side of the LMV cell including a VCO NFET and an RF mixer NFET connected in series with the LNA NFET. Due to these three-NFET stacks, the minimum supply voltage (VDD) for operation of the LMV cell is relatively high and, particularly, is equal to one threshold voltage plus three overdrive voltages. Thus, power consumption is relatively high.

SUMMARY

Disclosed herein are embodiments of an RF circuit structure. The structure can include a first transistor and a second transistor connected in series between a ground rail and a first LO signal node. The structure can further include a third transistor and a fourth transistor connected in series between the ground rail and a second LO signal node. The first transistor can have a first front gate and a first back gate. The second transistor can have a second front gate and a second back gate. The third transistor can have a third front gate and a third back gate. The fourth transistor can have a fourth front gate and a fourth back gate. The first front gate, the second back gate, the third front gate, and the fourth back gate can be connected to an RF signal node. The first back gate and the fourth front gate can be connected to the first LO signal node. The second front gate and the third back gate can be connected to the second LO signal node.

Some embodiments of the RF structure disclosed herein can include a first transistor and a second transistor connected in series between a ground rail and a first LO signal node. The structure can further include a third transistor and a fourth transistor connected in series between the ground rail and a second LO signal node. The first transistor can have a first front gate and a first back gate. The second transistor can have a second front gate and a second back gate. The third transistor can have a third front gate and a third back gate. The fourth transistor can have a fourth front gate and a fourth back gate. The first front gate, the second back gate, the third front gate, and the fourth back gate can be connected to an RF signal node. The first back gate and the fourth front gate can be connected to the first LO signal node. The second front gate and the third back gate can be connected to the second LO signal node. The first transistor, the second transistor, the third transistor, and the fourth transistor are dual-gate semiconductor-on-insulator N-channel field effect transistors.

Other embodiments of the RF structure disclosed herein can include a first transistor and a second transistor connected in series between a ground rail and a first LO signal node. The structure can further include a third transistor and a fourth transistor connected in series between the ground rail and a second LO signal node. The first transistor can have a first front gate and a first back gate. The second transistor can have a second front gate and a second back gate. The third transistor can have a third front gate and a third back gate. The fourth transistor can have a fourth front gate and a fourth back gate. The first front gate, the second back gate, the third front gate, and the fourth back gate can be connected to an RF signal node to receive an RF input signal. The first back gate and the fourth front gate can be connected to the first LO signal node. The second front gate and the third back gate can be connected to the second LO signal node. The structure can further include an amplifier. The amplifier can include the first transistor and the third transistor. The structure can further include oscillator. The oscillator can include the first LO signal node, the second transistor, the second LO signal node, and the fourth transistor. This oscillator can generate complementary LO signals including a first LO signal on the first LO signal node and a second LO signal on the second LO signal node. Within the structure, front and back gate biasing of the first transistor, the second transistor, the third transistor, and the fourth transistor with different combinations of the RF input signal and the complementary LO signals effectively mixes the RF input signal with each of the complementary LO signals to generate complementary IF output signals. These complementary IF output signals can include: a first IF output signal at a first IF signal node between the first transistor and the second transistor; and a second IF output signal at a second IF signal node between the third transistor and the fourth transistor.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which.

DETAILED DESCRIPTION

Figure 1:
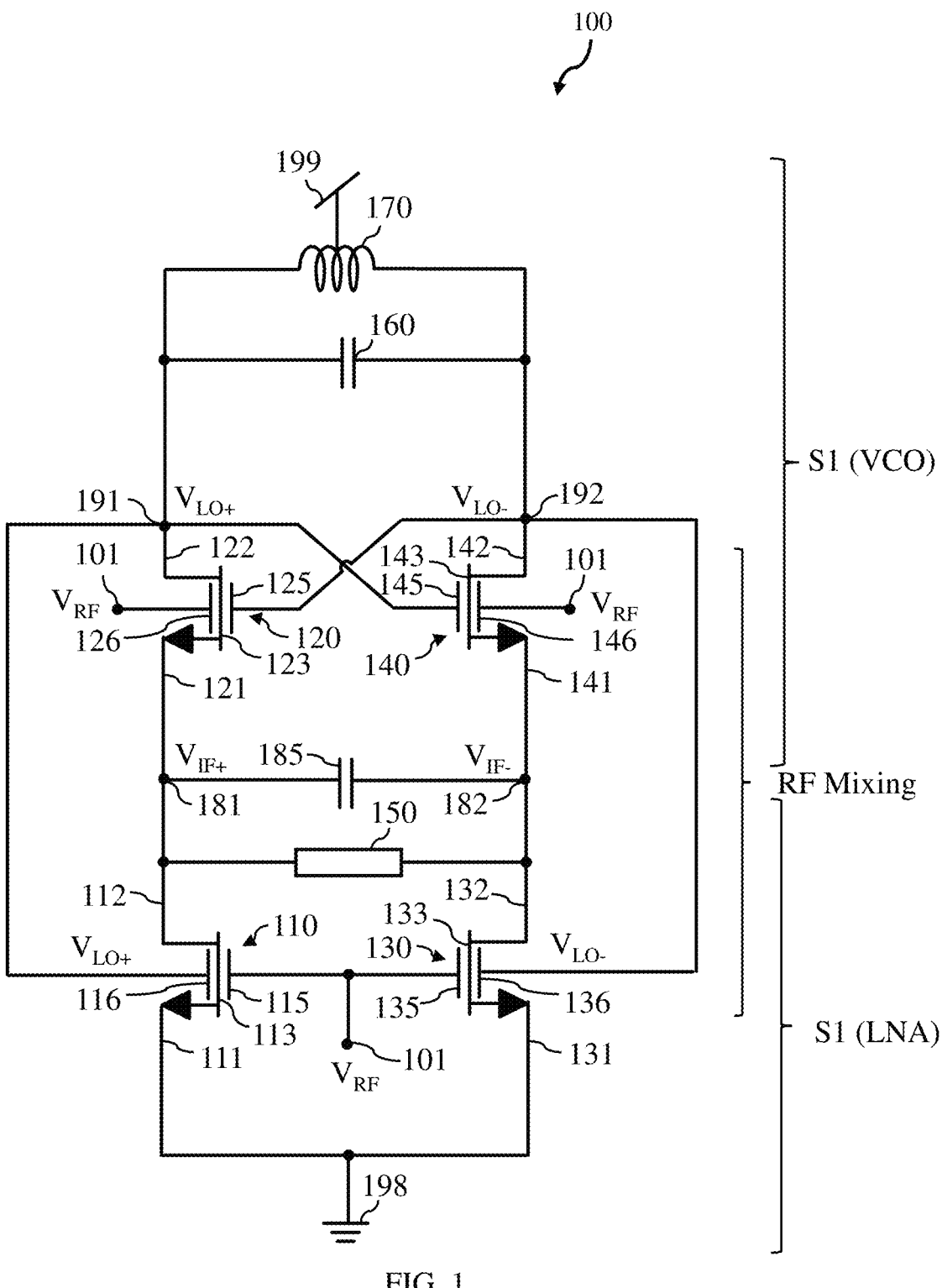
FIG. 1 is a schematic diagram illustrating disclosed embodiments of a radio frequency (RF) circuit structure.

As mentioned above, an LMV cell of an RF receiver can include an LNA, an RF mixer, and a VCO. In such an LMV cell, the LNA can amplify a received low-power RF input signal without significantly degrading the signal-to-noise ratio (SNR) and can output a differential RF signal (i.e., RF+ and RF−). The VCO can generate a particular differential local oscillator (LO) signal (i.e., LO+ and LO−). The RF mixer can receive the differential RF signal and the differential LO signal and can mix the signals. More particularly, the RF mixer can use the differential LO signal to convert the differential RF signal into a differential intermediate frequency (IF) output signal (i.e., IF+ and IF−) at a desired frequency (e.g., at a lower frequency than the differential RF signal). A typical LMV cell includes, among other components, one NFET for the LNA, two NFETs for the RF mixer, and two NFETs for the VCO. The arrangement of the LMV is symmetric with each side of the LMV cell including a VCO NFET and an RF mixer NFET connected in series with the LNA NFET. Due to these three-NFET stacks, the minimum supply voltage (VDD) for operation of the LMV cell is relatively high and, particularly, is equal to one threshold voltage plus three overdrive voltages. Thus, power consumption is relatively high.

In view of the foregoing, disclosed herein are embodiments of a radio frequency (RF) circuit (e.g., for an RF receiver) including a combined low noise amplifier (LNA), RF mixer, and voltage-controlled oscillator (VCO) circuit (also referred to herein as an LMV cell). This LMV cell includes an LNA component and a VCO component and further employs front and back gate biasing of dual-gate transistors within the LNA and VCO components to achieve signal mixing. More particularly, the LMV cell can include four dual-gate transistors (e.g., four transistors with independently biasable front and back gates). These four dual-gate transistors can include: first and second transistors connected in series between a ground rail and a first local oscillator (LO) signal node and third and fourth transistors connected in series between the ground rail and a second LO signal node. The first and third transistors can be components of an LNA, whereas the second and fourth transistors can be cross-coupled components of a VCO. This novel LMV cell can specifically be configured so the front and back gates of the four dual-gate transistors therein are biased with different combinations of an RF input signal, which is received at an RF signal node, and complementary LO signals, which are generated by the VCO on the first and second LO signal nodes. Such front and back gate biasing of the transistors effectively mixes the RF input signal with each of the complementary LO signals to generate complementary IF output signals including a first IF output signal at a first IF signal node between the first transistor and the second transistor and a second IF output signal at a second IF signal node between the third transistor and the fourth transistor. An LMV cell configured as described above requires fewer transistors than prior art LMV cells and, thus, consumes less chip area. Additionally, since this LMV cell includes only two-transistor stacks, it requires a lower minimum supply voltage (VDD) and, thus, consumes less power.

More particularly, FIG. 1 is a schematic diagram illustrating disclosed embodiments of an RF circuit (e.g., for an RF receiver) that includes a combined LNA, RF mixer, and VCO circuit (also referred to herein as an LMV cell 100). The LMV cell 100 can include two stages: an LNA stage (S1) and a VCO stage (S2). Additionally, as discussed in greater below, instead of including a discrete RF mixer stage, front and back gate biasing of dual-gate transistors within S1 and S2 is employed to achieve RF mixing.

The two stages of the LMV cell 100 (i.e., S1, and S2) can include a total of four dual-gate transistors and, particularly, a total of four dual-gate N-channel field effect transistors (NFETs) 110, 120, 130, 140. For purposes of this disclosure, a dual-gate NFET refers to an NFET with two independently biasable gates (referred to herein as front and back gates or primary and secondary gates). Such an NFET can include a channel region between source/drain regions. Those skilled in the art will also recognize that, in an NFET, the source/drain regions can be N-type source/drain regions at a relatively high conductivity level (e.g., can be N+ source/drain regions) and the channel region can be either an intrinsic (i.e., undoped) channel region or a P-type channel region at a relatively low conductivity level (e.g., a P-channel region). Front and back gate structures can be adjacent to opposing surfaces of the channel region. These front and back gate structures can further be electrically isolated from each other to enable independent front and back gate biasing. Various dual-gate FET structures are well known in the art and include, for example, planar dual-gate FET structures (e.g., FET structures in which front and back gates are adjacent to top and bottom surfaces of a semiconductor layer at a channel region) or non-planar dual-gate FET structures (e.g., FET structures in which front and back gates are adjacent opposing side surface of a semiconductor fin at a channel region). In in the LMV cell 100 of FIG. 1, any suitable dual-gate FET structure could be employed for dual-gate NFETs 110, 120, 130, and 140.

Figure 2:
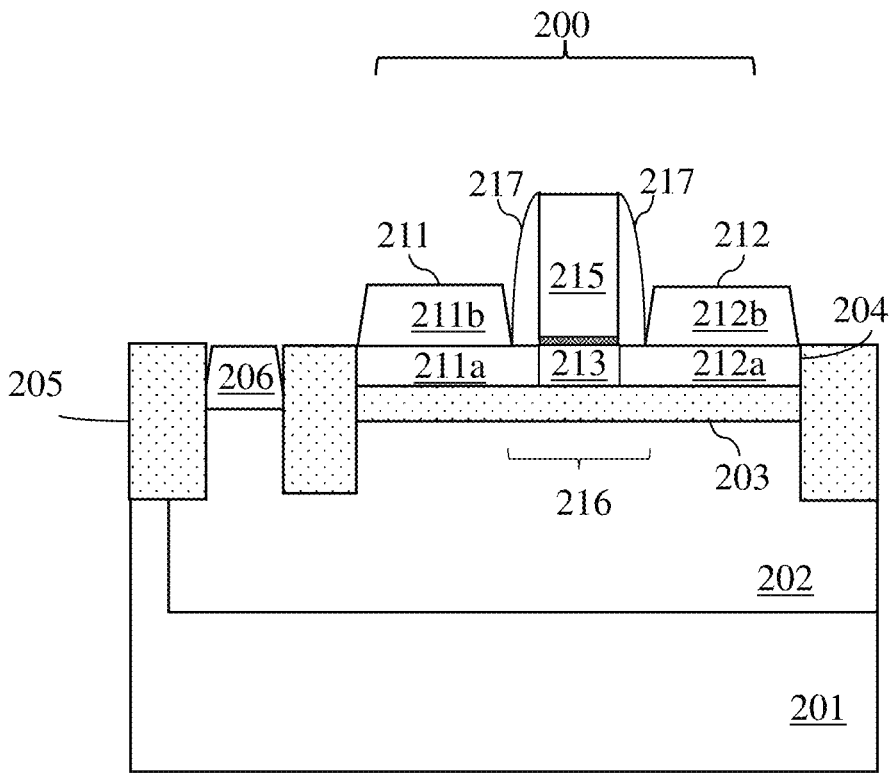
FIG. 2 is a cross-section diagram illustrating an example of a dual-gate transistor that can be incorporated into various embodiments (e.g., the structure of FIG. 1)

FIG. 2 is a cross-section diagram illustrating one example of a dual-gate NFET 200 (hereinafter referred to as NFET 200) that could be used for each of the dual-gate NFETs 110, 120, 130, and 140 in LMV cell 100. NFET 200 can be formed using an advanced semiconductor-on-insulator technology processing platform. That is, this NFET 200 can be a semiconductor-on-insulator FET (e.g., silicon-on-insulator (SOI) FET), such as either a fully-depleted semiconductor-on-insulator FET (e.g., a fully-depleted SOI (FDSOI) FET) or a partially-depleted semiconductor-on-insulator FET (e.g., a partially-depleted SOI (PDSOI) FET).

A semiconductor substrate 201 can be, for example, a monocrystalline silicon substrate or, alternatively, a monocrystalline substrate of any other suitable semiconductor material (e.g., silicon germanium, etc.). An insulator layer 203 can be on the top surface of semiconductor substrate 201. Insulator layer 203 can be, for example, a silicon dioxide layer or a layer of any other suitable insulator material. A semiconductor layer 204 can be on the top surface of insulator layer 203. Semiconductor layer 204 can be, for example, a monocrystalline silicon layer or a layer of any other suitable monocrystalline semiconductor material (e.g., silicon germanium, etc.).

Trench isolation regions 205 (e.g., shallow trench isolation (STI) structures) can define active device region(s) for one or more FETs 200 within semiconductor layer 204 and can electrically isolate NFET 200 from other devices, as desired and/or necessary. Such STI structures can include, for example, one or more trenches patterned (e.g., lithographically) and etched so as to extend vertically from the top surface of semiconductor layer 204 to (and optionally through) insulator layer 203. The trench(es) can be filled with one or more layers of isolation materials (e.g., silicon dioxide, silicon nitride, silicon oxynitride, etc.), thereby forming the STI structures.

NFET 200 can include, within its active device region, a channel region 213 positioned laterally between a source region 211 and a drain region 212. Source/drain regions 211-212 can include lower source/drain portions 211a-212a including doped regions of semiconductor layer 204 on either side of channel region 213. Optionally, source/drain regions 211-212 can further include upper source/drain portions 211b-212b (also referred to herein as raised source/drain regions) above and immediately adjacent to lower source/drain portions 211a-212a, respectively. Upper source/drain portions 211b-212b can include epitaxially grown monocrystalline semiconductor layers (e.g., epitaxially grown silicon layers). As discussed above, in an NFET, source/drain regions 211-212 can be N+ source/drain regions and channel region 213 can be either an intrinsic channel region or a P-channel region.

NFET 200 can further include a front gate 215 (also referred to herein as a primary gate) adjacent to (e.g., above, and immediately adjacent to) the active device region at channel region 213. Front gate 215 can include a gate dielectric layer (including one or more layers of gate dielectric material) immediately adjacent to channel region 213 and a gate conductor layer (including one or more layers of gate conductor material) on the gate dielectric layer. Front gate 215 could be any of a gate-first polysilicon gate structure, a gate-first high-K metal gate (HKMG) structure, a gate-last HKMG structure (also referred to as a replacement metal gate (RMG) structure), or any other suitable type of front gate structure. Gate sidewall spacers 217 can further be positioned laterally adjacent to sidewalls of front gate 215 to electrically isolate it from the adjacent source/drain regions 211-212. Front gate structures with gate sidewall spacers are well known in the art and, thus, the details thereof have been omitted from the specification in order to allow the reader to focus on the salient aspects of the disclosed embodiments.

NFET 200 can further include a back gate 216 (also referred to herein as a secondary gate). Specifically, semiconductor substrate 201 can include a well region 202 therein. Well region 202 can be located at the top surface of semiconductor substrate 201 immediately adjacent insulator layer 203 and can further be aligned below the active device region. For purposes of this disclosure, a well region refers to a region of semiconductor material doped (e.g., via a dopant implantation process or any other suitable doping process) so as to have a particular conductivity type.

Those skilled in the art will recognize that one advantage of advanced semiconductor-on-insulator technology processing platforms is that FETs can be formed on an insulator layer above a particular type of well region (e.g., an N-type well region (Nwell) or a P-type well region (Pwell)) in order to achieve different types of NFETs or PFETs with different threshold voltages (VTs). For example, for a super low threshold voltage (SLVT) or low threshold voltage (LVT) FET, an NFET can be formed above an Nwell and a PFET can be formed above a Pwell. For a regular threshold voltage (RVT) or high threshold voltage (HVT) FET, an NFET can be formed above a Pwell and a PFET can be formed above an Nwell. Typically, a circuit block will include all SLVT (or LVT) FETs with NFETs above Nwells and PFETs above Pwells or all RVT (or HVT) FETs with NFETs above Pwells and PFETs above Nwells. Whether the FETs are SLVT or LVT FETs or whether they are RVT or HVT FETs will depend upon the design (e.g., device size, etc.) and process specifications (e.g., dopant concentrations, etc.). In LMV cell 100, NFETs 110, 120, 130, and 140 can be, for example, SLVT or LVT transistors. That is, NFETs 110, 120, 130, 140 could be aligned above an Nwell. Alternatively, in LMV cell 100, all NFETs 110, 120, 130, and 140 could be RVT or HVT transistors. That is, NFETs 110, 120, 130, and 140 could be aligned above a Pwell.

Another advantage of advanced semiconductor-on-insulator technology processing platforms is that portions of the insulator layer and well regions aligned below a FET effectively form a back gate, which can be biased (referred to as back gate biasing or back-biasing) to fine tune the threshold voltage. Forward back-biasing (FBB) refers to applying a gate bias voltage to the back gate (particularly, to the well region thereof) to reduce the VT of the FET. Reverse back-biasing (RBB) refers specifically to applying a gate bias voltage to the back gate (particularly, to the well region thereof) to increase the VT of the FET, thereby decreasing the switching speed and reducing leakage current. Thus, in NFET 200, portions of insulator layer 203 and well region 202 aligned below channel region 213 effectively form a back gate 216. To facilitate back gate biasing, NFET 200 can include a well contact region 206 (also referred to herein as a well tap). Specifically, the structure can further include a bulk region (also referred to as a hybrid region). This bulk region can be devoid of insulator layer 203 and instead can include well contact region 206 at the top surface of semiconductor substrate 201 immediately adjacent to well region 202, and electrically isolated from the active device region by STI structures.

Well contact region 206 can include, for example, an epitaxial monocrystalline semiconductor layer (e.g., an epitaxial silicon layer or an epitaxial layer of any other suitable semiconductor material), which is grown on the top surface of semiconductor substrate 201 immediately adjacent to well region 202 and either in situ doped or subsequently implanted so as to have the same type conductivity but at a higher conductivity level than the well region below. Alternatively, well contact region 206 could be a highly doped region within and at the top surface of well region 202. Given the above-described structure, front gate 215 and back gate 216 of NFET 200 are independently biasable. That is, they can be biased by different bias voltage signals.

Referring again to FIG. 1, the four dual-gate NFETs of LMV cell 100 can include a first dual-gate NFET 110 (hereinafter referred to as first transistor 110), a second dual-gate NFET 120 (hereinafter referred to as second transistor 120), a third dual-gate NFET 130 (hereinafter referred to as third transistor 130), and a fourth dual-gate NFET 140 (hereinafter referred to as fourth transistor 140).

Within LMV cell 100, first transistor 110 and second transistor 120 can be electrically connected in series between a ground rail 198 and a first LO signal node 191. That is, first transistor 110 can include: a first source region 111, which is electrically connected to ground rail 198; a first drain region 112; and a first channel region 113 between first source region 111 and first drain region 112. First transistor 110 can further include a first front gate 115 and a first back gate 116 adjacent to opposing surfaces of first channel region 113. Second transistor 120 can include: a second source region 121, which is electrically connected to first drain region 112 of first transistor 110; a second drain region 122, which is electrically connected to first LO signal node 191; and a second channel region 123 between second source region 121 and second drain region 122. Second transistor 120 can further include a second front gate 125 and a second back gate 126 adjacent to opposing surfaces of second channel region 123.

Additionally, within LMV cell 100, third transistor 130 and fourth transistor 140 can be electrically connected in series between ground rail 198 and a second LO signal node 192. That is, third transistor 130 can include: a third source region 131, which is electrically connected to ground rail 198; a third drain region 132; and a third channel region 133 between third source region 131 and third drain region 132. Third transistor 130 can further include a third front gate 135 and a third back gate 136 adjacent to opposing surfaces of third channel region 133. Fourth transistor 140 can include: a fourth source region 141, which is electrically connected to fourth drain region 142 of fourth transistor 140; a fourth drain region 142, which is electrically connected to second LO signal node 192; and a fourth channel region 143 between fourth source region 141 and fourth drain region 142. Fourth transistor 140 can further include a fourth front gate 145 and a fourth back gate 146 adjacent to opposing surfaces of fourth channel region 143.

Within LMV cell 100, first front gate 115 of first transistor 110, second back gate 126 of second transistor 120, third front gate 135 of third transistor 130, and fourth back gate 146 of fourth transistor 140 can all be electrically connected to an RF signal node 101. This RF signal node 101 can further be connected to a receive an RF input signal ($V_{RF}$) (e.g., via an antenna of the RF receiver). $V_{RF}$ can be a single ended RF input signal. Additionally, first back gate 116 of first transistor 110 and fourth front gate 145 of fourth transistor 140 can be electrically connected to first LO signal node 191, whereas second front gate 125 of second transistor 120 and third back gate 136 of third transistor 130 can be electrically connected to second LO signal node 192. Thus, second transistor 120 and fourth transistor 140 are cross-coupled.

LNA stage (S1) (also referred to herein as the amplifier) can include first transistor 110 and third transistor 130. Optionally, S1 can further include a resistor 150, which has end terminals electrically connected to first drain region 112 of first transistor 110 and third drain region 132 of third transistor 130. Optionally, S1 could further include an inductor (not shown), which is electrically connected to ground rail 198 and which has end terminals electrically connected to first source region 111 of first transistor 110 and third source region 131 of third transistor 130.

VCO stage S2 (also referred to herein as the oscillator) can include the cross-coupled second and fourth transistors 120 and 140. S2 can further include the first and second LO signal nodes 191 and 192. S2 can further include an inductor 170, which is electrically connected to a positive supply voltage rail 199 at a positive supply voltage level (VDD) and which has end terminals electrically connected to the first and second LO signal nodes 191 and 192, respectively. Optionally, S2 can further include a capacitor 160, which has capacitor plates electrically connected to the first and second LO signal nodes 191 and 192, respectively, and which further has a capacitor dielectric between the capacitor plates. Optionally, S1 could further include a resistor (not shown), which has end terminals electrically connected to the first and second LO signal nodes 191 and 192, respectively. With a configuration, as described above, this VCO stage (S2) can generate complementary LO signals and, particularly, a first LO signal ($V_{LO+}$) and a second LO signal ($V_{LO-}$) on the first LO signal node 191 and the second LO signal node 192, respectively.

As a result of the various connections described above between the front and back gates of each dual-gate NFET 110, 120, 130, and 140 and the RF signal node 101 and either the first LO signal node 191 or the second LO signal node 192, the front and back gates of the four dual-gate NFETs 110, 120, 130, and 140 will be biased with different combinations of the RF input signal ($V_{RF}$), which is received at the RF signal node 101, and the complementary LO signals (i.e., $V_{LO+}$ and $V_{LO-}$), which are generated by S2 on the first and second LO nodes 191 and 192, respectively. Specifically, in first transistor 110, first front gate 115 is biased with $V_{RF}$ and first back gate 116 is biased with $V_{LO+}$. In second transistor 120, second front gate 125 is biased with $V_{LO-}$ and second back gate 126 is biased with $V_{RF}$. In third transistor 130, third front gate 135 is biased with $V_{RF}$ and third back gate 136 is biased with $V_{LO-}$. In fourth transistor 140, fourth front gate 145 is biased with $V_{LO+}$ and fourth back gate 146 is biased with $V_{RF}$. Such front and back gate biasing of each of the four dual-gate transistors 110, 120, 130, and 140 mixes the RF input signal ($V_{RF}$) with each of the complementary LO signals ($V_{LO+}$ and $V_{LO-}$) to generate complementary IF output signals. These complementary IF output signals include a first IF output signal ($V_{IF+}$) at a first IF signal node 181 between first transistor 110 and second transistor 120 and a second IF output signal ($V_{IF-}$) at a second IF signal node 182 between third transistor 130 and fourth transistor 140. As illustrated, LMV cell 100 can optionally include a capacitor 185 with capacitor plates electrically connected to the first and second IF signal nodes 181 and 182, respectively, and with a capacitor dielectric between the capacitor plates.

Figure 3A:
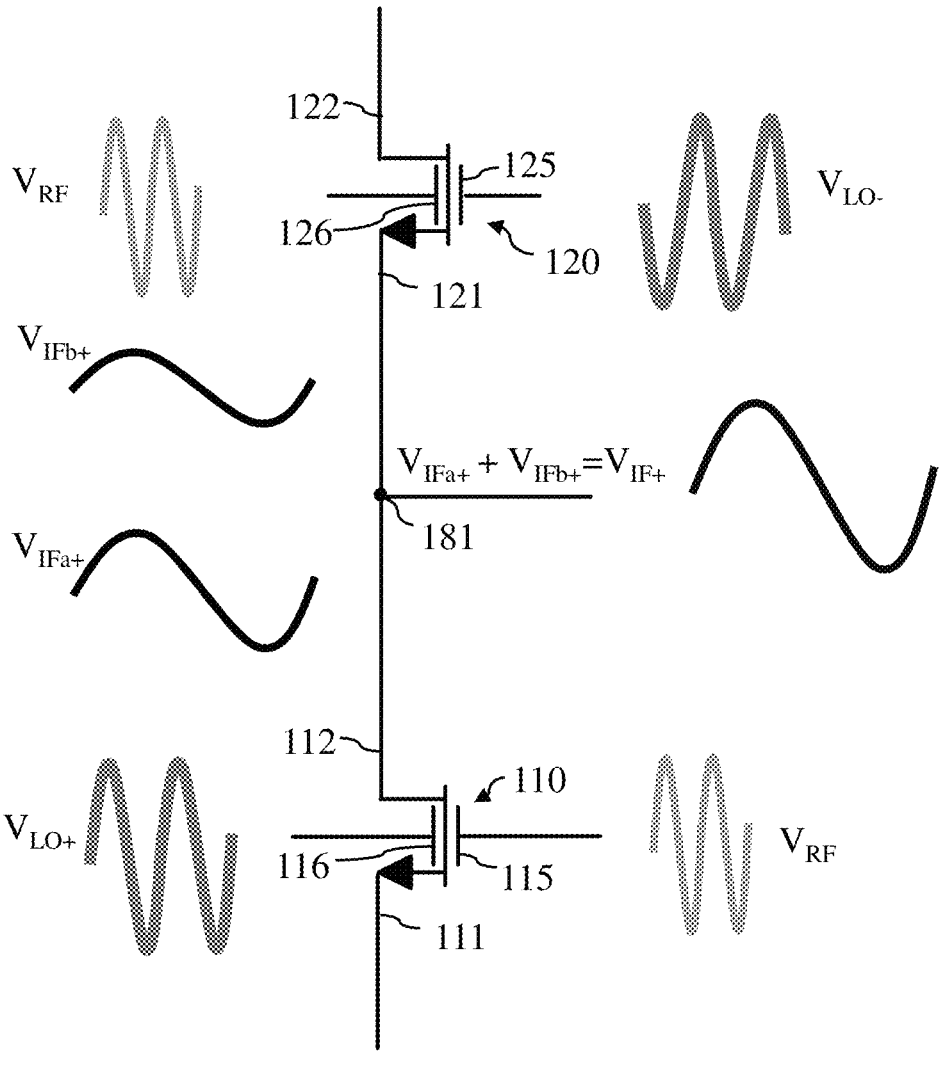
FIGS. 3A-3B are schematic diagrams illustrating RF mixing operations performed through front and back gate biasing transistors in various embodiments (e.g., the structure of FIG. 1)
Figure 3B:
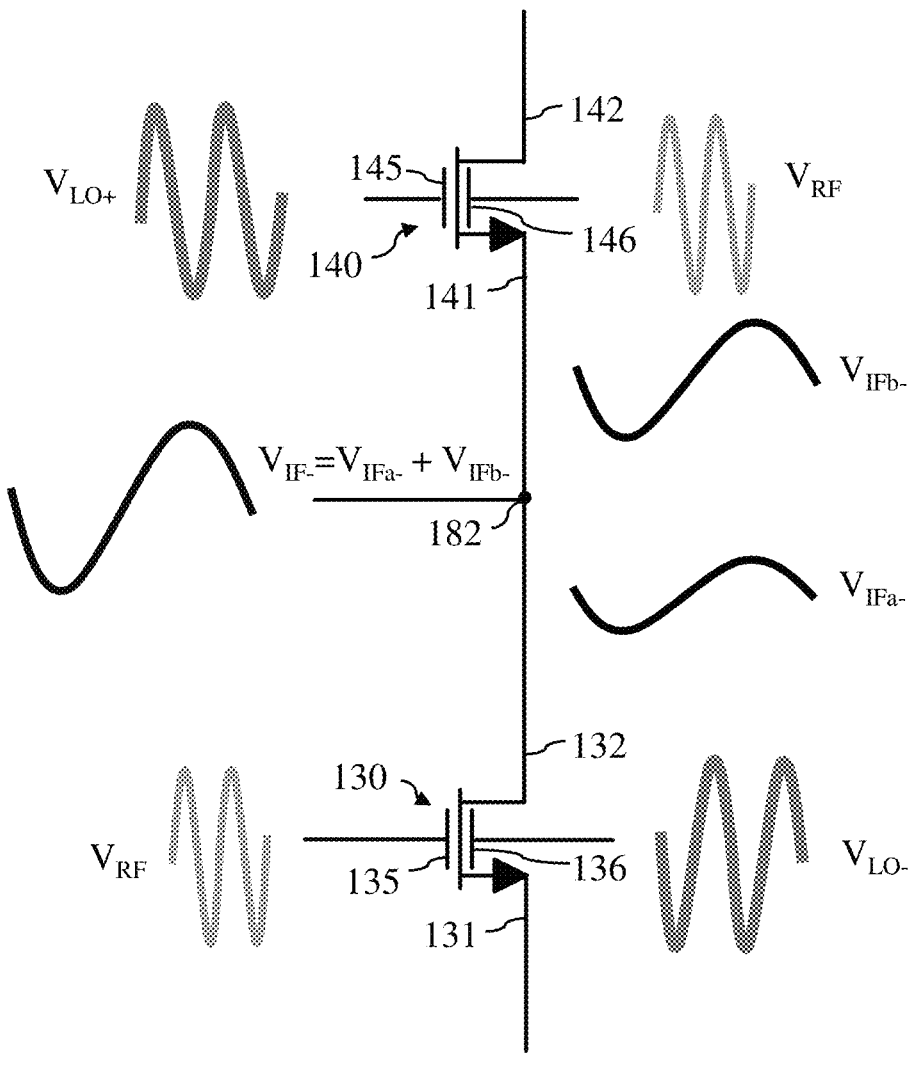

FIG. 3A is a schematic diagram illustrating, in greater detail, an RF mixing operation performed through front and back gate biasing of first transistor 110 and second transistor 120. In first transistor 110, first front gate 115 is biased with $V_{RF}$ and first back gate 116 is biased with $V_{LO+}$, resulting in a voltage signal ($V_{IFa+}$) on first drain region 112 with a relatively large amplitude. In second transistor 120, second front gate 125 is biased with $V_{LO-}$ and second back gate 126 is biased with $V_{RF}$, resulting in a different voltage signal ($V_{IFb+}$) on second source region 121 with a relatively small amplitude. $V_{IFa+}$ and $V_{IFb+}$ combine at first IF signal node 181 to achieve $V_{IF+}$. FIG. 3B is a schematic diagram illustrating, in greater detail, an RF mixing operation performed through front and back gate biasing of third transistor 130 and fourth transistor 140. In third transistor 130, third front gate 135 is biased with $V_{RF}$ and third back gate 136 is biased with $V_{LO-}$, resulting in a voltage signal ($V_{IFa-}$) on third drain region 132 with a relatively small amplitude. In fourth transistor 140, fourth front gate 145 is biased with $V_{LO+}$ and fourth back gate 146 is biased with $V_{RF}$, resulting in a different voltage signal ($V_{IFb-}$) on fourth source region 141 with a relatively large amplitude. $V_{IFa-}$ and $V_{IFb-}$ combine at second IF signal node 182 to achieve $V_{IF-}$.

As illustrated, voltage signals $V_{IFa+}$ and $V_{IFb+}$ are in-phase sine waves so that their sum of $V_{IF+}$ is also a sine wave. Similarly, the voltage signals $V_{IFa-}$ and $V_{IFb-}$ are in-phase sine waves so that their sum of $V_{IF-}$ is also a sine wave. Furthermore, $V_{IFa+}$ and $V_{IFb+}$ are inverted with respect to $V_{IFb-}$ and $V_{IFa-}$, respectively, such that $V_{IF+}$ and $V_{IF-}$ have the same magnitude and are inverted with respect to each other (i.e., complementary).

Proper sizing of the dual-gate transistors 110, 120, 130, and 140 can be performed during design to ensure that the voltage signals $V_{IFa+}$, $V_{IFb+}$, $V_{IF+}$, $V_{IFa-}$, $V_{IFb-}$, and $V_{IF+}$ have the relative properties described above and illustrated in FIGS. 3A-3B. Specifically, to generate the complementary IF output signals $V_{IF+}$ and $V_{IF-}$, the second transistor 120 and fourth transistor 140 can be larger than first transistor 110 and third transistor 130. For example, the first transistor 110 and the third transistor 130 can have a first channel width and the second transistor 120 and the fourth transistor can have a second channel width that is larger than the first channel width. In some embodiments, the second channel width could be at least two times larger than the first channel width (e.g., the second channel width could be up to or greater than three times the first channel width).

For LMV cell 100, the following equations can, for example, be employed to solve for $I_{out}$ and, thereby $V_{IF+}$ at first IF signal node 181:

$$I_{out}=I_{ds2}-I_{ds1}. \tag{1}$$

where $I_{ds1}$ refers to drain-source current of first transistor 110 and where $I_{ds2}$ refers to drain-source current of second transistor 120.

$$I_{ds1}=g_{m1}(V_{LO+})V_{RF}+g_{mb1}V_{LO+}, \tag{2}$$

where $g_{m1}$ refers to transconductance due to biasing of first front gate 115, and $g_{mb1}$ refers to transconductance due to biasing of first back gate 116.

$$I_{ds2}=g_{m2}(V_{RF})V_{LO-}+g_{mb2}V_{RF}. \tag{3}$$

where $g_{m2}$ refers to transconductance due to biasing of second front gate 125, and $g_{mb2}$ refers to transconductance due to biasing of second back gate 126.

Thus, $$I_{out}=(g_{m2}(V_{RF})V_{LO-}+g_{mb2}V_{RF})-(g_{m1}(V_{LO+})V_{RF}+g_{mb1}V_{LO+}). \tag{4}$$

It should be understood that similar equations can be used to solve for $I_{out}$ and thereby $V_{IF-}$ at second IF signal node 182.

Figure 4:
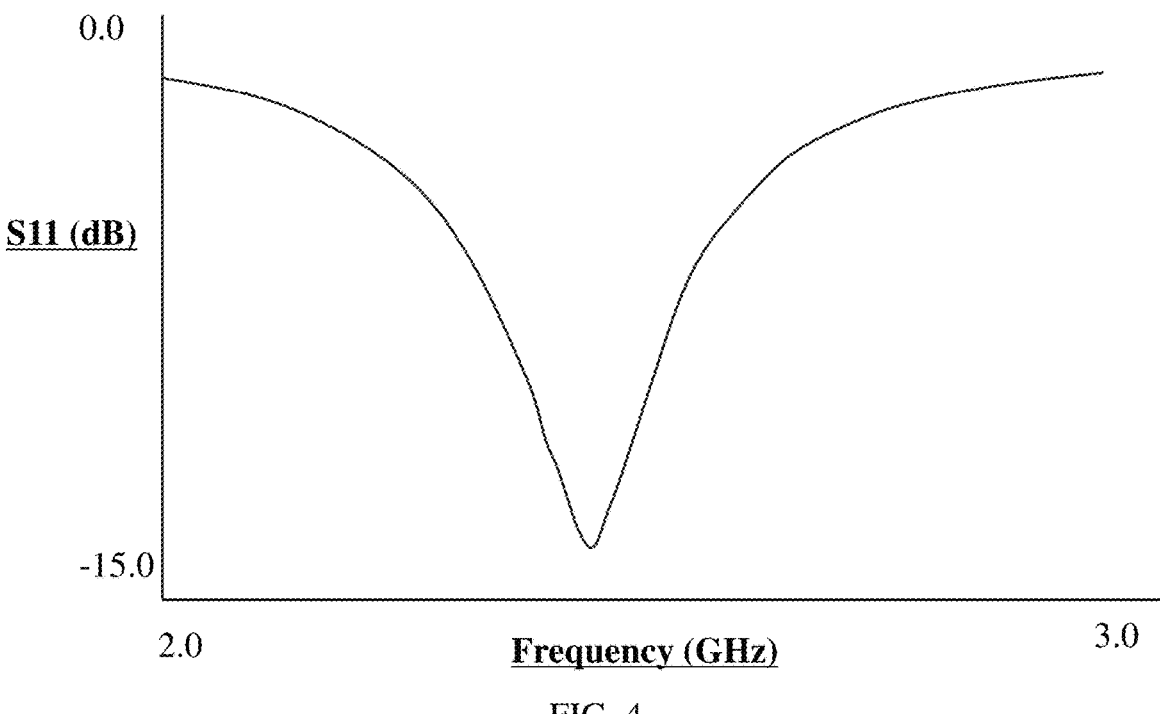
FIG. 4 is a graph illustrating reflected power achievable using in various embodiments (e.g., the structure of FIG. 1)
Figure 5:
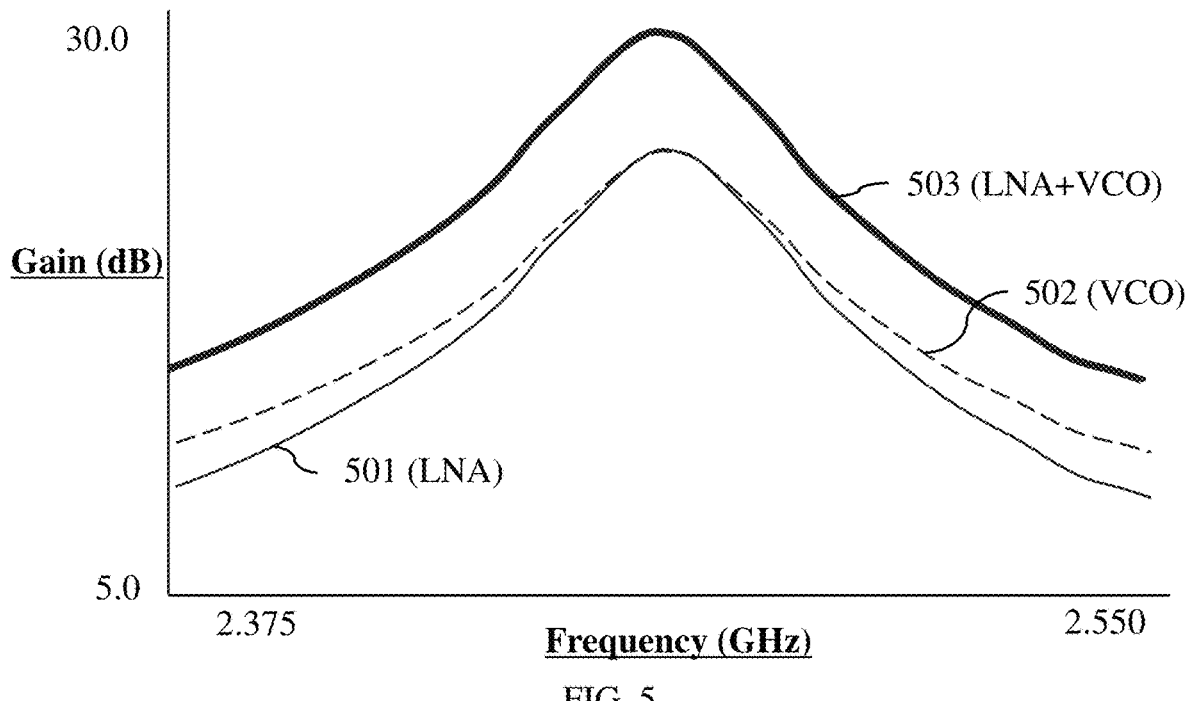
FIG. 5 is a graph illustrating the relationship between gain in decibels (dB) and frequency in gigahertz (GHz) achievable in various embodiments (e.g., using the structure of FIG. 1).

FIG. 4 is a graph illustrating the relationship between S11 in decibels (dB) and input frequency in gigahertz (GHz) and, particularly, illustrating minimal reflected power achievable using LMV cell 100. FIG. 5 is a graph illustrating the relationship between gain in decibels (dB) and frequency in gigahertz (GHz) for voltage signals output from LNA stage S1 (see curve 501), for voltage signals output from VCO stage S2 (see curve 502), and for voltage signals output by LNA and VCO in combination (i.e., for $V_{IF+}$ and $V_{IF-}$) (see curve 503).

Techniques for forming various different types of dual-gate NFETs and other devices (e.g., resistors, capacitors, inductors, etc.) on a substrate and for forming interconnects (e.g., middle of the line (MOL) contacts and/or back end of the line (BEOL) wires and/or vias) that will electrically such NFETs and other devices in a particular manner to each other, to voltage rails, to signal nodes, etc. are known in the art. Thus, the details of these techniques have been omitted from the specification in order to allow the reader to focus on the salient aspects of the disclosed LMV cell 100 and, particularly, those aspects related to using front and back gate biasing of dual-gate transistors within LNA and VCO components of the LMV cell 100 to achieve RF mixing.

An LMV cell 100 configured as described above requires fewer transistors than prior art LMV cells and, thereby consumes less chip area. Additionally, since only two transistors are ever stacked together with the LMV cell, it requires a lower minimum supply voltage (VDD) and, thereby consumes less power (e.g., 25% less DC power consumption) with only a slight penalty to conversion gain (e.g., 1.6 dB or less).

It should be understood that in the method and structures described above, a semiconductor material refers to a material whose conducting properties can be altered by doping with an impurity. Example semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a," "an," and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a first transistor and a second transistor connected between a ground rail and a first local oscillator signal node; and
a third transistor and a fourth transistor connected between the ground rail and a second local oscillator signal node,
wherein the first transistor has a first front gate and a first back gate, the second transistor has a second front gate and a second back gate, the third transistor has a third front gate and a third back gate, and the fourth transistor has a fourth front gate and a fourth back gate,
wherein the first front gate, the second back gate, the third front gate, and the fourth back gate are connected to a radio frequency signal node,
wherein the first back gate and the fourth front gate are connected to the first local oscillator signal node, and
wherein the second front gate and the third back gate are connected to the second local oscillator signal node.

2. The structure of claim 1, wherein the second transistor and the fourth transistor are larger than the first transistor and the second transistor.

3. The structure of claim 1, wherein the first transistor and the third transistor have a first channel width and the second transistor and the fourth transistor have a second channel width that is at least two times larger than the first channel width.

4. The structure of claim 1, further comprising:
an amplifier including: the first transistor; and the third transistor; and
an oscillator including: the first local oscillator signal node; the second transistor; the second local oscillator signal node; and the fourth transistor, wherein the oscillator generates complementary local oscillator signals including a first local oscillator signal on the first local oscillator signal node and a second local oscillator signal on the second local oscillator signal node.

5. The structure of claim 4,
wherein the radio frequency signal node is connected to receive a radio frequency input signal, and
wherein front and back gate biasing of the first transistor, the second transistor, the third transistor, and the fourth transistor with different combinations of the radio frequency input signal and the complementary local oscillator signals mixes the radio frequency input signal with each of the complementary local oscillator signals to generate complementary intermediate frequency output signals including a first intermediate frequency output signal at a first intermediate frequency signal node between the first transistor and the second transistor and a second intermediate frequency output signal at a second intermediate frequency signal node between the third transistor and the fourth transistor.

6. The structure of claim 5, further comprising a capacitor connected between the first intermediate frequency signal node and the second intermediate frequency signal node.

7. The structure of claim 4, wherein the oscillator further includes a capacitor and an inductor connected in parallel between the first local oscillator signal node and the second local oscillator signal node.

8. The structure of claim 7, wherein the inductor is connected to a positive supply voltage rail.

9. The structure of claim 1, wherein the first transistor, the second transistor, the third transistor, and the fourth transistor are dual-gate N-channel field effect transistors.

10. A structure comprising:
a first transistor and a second transistor connected between a ground rail and a first local oscillator signal node; and
a third transistor and a fourth transistor connected between the ground rail and a second local oscillator signal node,
wherein the first transistor has a first front gate and a first back gate, the second transistor has a second front gate and a second back gate, the third transistor has a third front gate and a third back gate, and the fourth transistor has a fourth front gate and a fourth back gate,
wherein the first front gate, the second back gate, the third front gate, and the fourth back gate are connected to a radio frequency signal node,
wherein the first back gate and the fourth front gate are connected to the first local oscillator signal node,
wherein the second front gate and the third back gate are connected to the second local oscillator signal node, and wherein the first transistor, the second transistor, the third transistor, and the fourth transistor are dual-gate semiconductor-on-insulator N-channel field effect transistors.

11. The structure of claim 10, wherein the second transistor and the fourth transistor are larger than the first transistor and the second transistor.

12. The structure of claim 10, wherein the first transistor and the third transistor have a first channel width and the second transistor and the fourth transistor have a second channel width threat least two times larger than the first channel width.

13. The structure of claim 10, further comprising:
an amplifier including: the first transistor; and the third transistor; and
an oscillator including: the first local oscillator signal node; the second transistor; the second local oscillator signal node; and the fourth transistor, wherein the oscillator generates complementary local oscillator signals including a first local oscillator signal on the first local oscillator signal node and a second local oscillator signal on the second local oscillator signal node.

14. The structure of claim 13,
wherein the radio frequency signal node is connected to receive a radio frequency input signal, and
wherein front and back gate biasing of the first transistor, the second transistor, the third transistor, and the fourth transistor with different combinations of the radio frequency input signal and the complementary local oscillator signals mixes the radio frequency input signal with each of the complementary local oscillator signals to generate complementary intermediate frequency output signals including a first intermediate frequency output signal at a first intermediate frequency signal node between the first transistor and the second transistor and a second intermediate frequency output signal at a second intermediate frequency signal node between the third transistor and the fourth transistor.

15. The structure of claim 14, further comprising any of a capacitor connected between the first intermediate frequency signal node and the second intermediate frequency signal node.

16. The structure of claim 14, wherein the oscillator further includes a capacitor and an inductor connected in parallel between the first local oscillator signal node and the second local oscillator signal node.

17. The structure of claim 16, wherein the inductor is connected to a positive supply voltage rail.

18. The structure of claim 10, wherein each dual-gate semiconductor-on-insulator N-channel field effect transistor includes:
an active device region in a semiconductor layer on an insulator layer above a semiconductor substrate, wherein the active device region includes a channel region positioned laterally between source/drain regions;

a front gate above the semiconductor layer at the channel region; and
a back gate including portions of the insulator layer and a well region within the semiconductor substrate aligned below the channel region.

19. The structure of claim 18, wherein the well region includes an N-type well region.

20. A structure comprising:
a first transistor and a second transistor connected between a ground rail and a first local oscillator signal node;
a third transistor and a fourth transistor connected between the ground rail and a second local oscillator signal node,
wherein the first transistor has a first front gate and a first back gate, the second transistor has a second front gate and a second back gate, the third transistor has a third front gate and a third back gate, and the fourth transistor has a fourth front gate and a fourth back gate,
wherein the first front gate, the second back gate, the third front gate, and the fourth back gate are connected to a radio frequency signal node to receive a radio frequency input signal,
wherein the first back gate and the fourth front gate are connected to the first local oscillator signal node, and
wherein the second front gate and the third back gate are connected to the second local oscillator signal node;
an amplifier including: the first transistor; and the third transistor; and
an oscillator including: the first local oscillator signal node; the second transistor; the second local oscillator signal node; and the fourth transistor,
wherein the oscillator generates complementary local oscillator signals including a first local oscillator signal on the first local oscillator signal node and a second local oscillator signal on the second local oscillator signal node, and
wherein front and back gate biasing of the first transistor, the second transistor, the third transistor, and the fourth transistor with different combinations of the radio frequency input signal and the complementary local oscillator signals mixes the radio frequency input signal with each of the complementary local oscillator signals to generate complementary intermediate frequency output signals including a first intermediate frequency output signal at a first intermediate frequency signal node between the first transistor and the second transistor and a second intermediate frequency output signal at a second intermediate frequency signal node between the third transistor and the fourth transistor.

* * * * *